United States Patent
Lee

(12) 
(10) Patent No.: US 6,516,516 B1
(45) Date of Patent: Feb. 11, 2003

(54) SEMICONDUCTOR CHIP PACKAGE HAVING CLIP-TYPE OUTLEAD AND FABRICATION METHOD OF SAME

(75) Inventor: Byeong-Duck Lee, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 567 days.

(21) Appl. No.: 09/121,036

(22) Filed: Jul. 23, 1998

Related U.S. Application Data

(62) Division of application No. 08/759,210, filed on Dec. 5, 1996, now Pat. No. 5,821,615.

(30) Foreign Application Priority Data

Jun. 12, 1995 (KR) .............................. 95-47162

(51) Int. Cl.[7] .................... H01R 43/00; H05K 13/00
(52) U.S. Cl. ................ 29/855; 29/832; 29/840
(58) Field of Search ........................ 29/855, 840, 832, 29/830; 257/686, 723, 796, 692

(56) References Cited

U.S. PATENT DOCUMENTS

| | | | | |
|---|---|---|---|---|
| 4,079,511 A | * | 3/1978 | Grabbe ...................... | 29/627 |
| 5,084,694 A | * | 1/1992 | Kikuchi ..................... | 29/612 |
| 5,097,246 A | * | 3/1992 | Cooke et al. ............... | 337/297 |
| 5,471,088 A | * | 11/1995 | Song ........................ | 257/668 |
| 5,554,886 A | * | 9/1996 | Song ........................ | 257/666 |
| 5,604,978 A | * | 2/1997 | Sherif et al. ................ | 29/840 |
| 5,625,221 A | * | 4/1997 | Kim et al. .................. | 257/686 |
| 5,818,107 A | * | 10/1998 | Pierson et al. .............. | 257/723 |

FOREIGN PATENT DOCUMENTS

| | | | |
|---|---|---|---|
| JP | 52-19971 | 2/1977 | ................ 257/692 |
| JP | 5-183103 | 7/1993 | ................ 257/686 |

\* cited by examiner

*Primary Examiner*—Rick K. Chang
(74) *Attorney, Agent, or Firm*—Fleshner & Kim, LLP

(57) ABSTRACT

A semiconductor chip package having a clip type lead frame and fabrication thereof. The package includes a semiconductor chip having a plurality of bond pads thereon, a first package body having a recess, a plurality of inner leads each connected electrically to a corresponding one of the bond pads, a plurality of outleads each extended from a corresponding one of the inner leads for covering along sides of the first package body, and a second package body which covers the semiconductor chip, a plurality of metallic wires and the inner leads. The fabrication method includes the steps of forming a first package body having a recess therein, attaching to the first package body a plurality of inner leads and outleads extended from the inner leads thus to be coveringly exposed on sides of the first package body, attaching in the recess a semiconductor chip having a plurality of bond pads thereon, wire-bonding for electrically connecting each of the inner leads by a metallic wire to a corresponding one of the bond pads provided on the semiconductor chip, and forming a second package body for covering the semiconductor chip, the inner leads and the metallic wires.

17 Claims, 4 Drawing Sheets

SEMICONDUCTOR CHIP PACKAGE HAVING CLIP-TYPE OUTLEAD AND FABRICATION METHOD OF SAME

This application is a divisional of application Ser. No. 8/759,210 filed Dec. 5, 1996 now U.S. Pat. No. 5,821,615.

BACKGROUND OF THE INVENTION

1. Field of the Invention

The present invention relates to a semiconductor chip package, and more particularly to a semiconductor chip package having a clip-type lead frame and fabrication method thereof for enabling a variety of mountings on a printed circuit board.

2. Description of the Prior Art

As shown in FIGS. 1A and 1B showing an inner structure of a semiconductor chip package according to a conventional art, a lead frame 3 provided in semiconductor chip packages 1, 1' includes a die paddle 4 having a semiconductor chip 2 attached thereon, a plurality of inner leads 5 adjacent to the die paddle 4, and a plurality of outleads 6 each extended from a corresponding one of the inner leads 5.

In the packages 1, 1' having such a lead frame structure, the chip 2 attached on the die paddle 4 is electrically connected to the inner leads 5 of the lead frame 3, and the die paddle 2 having the chip 2 thereon and the inner leads 5 are molded by a molding compound 8.

The fabrication of the thusly composed semiconductor chip package is completed by carrying out: a die bonding for attaching the semiconductor chip 2 sliced off from a wafer on the die paddle 4 of the lead frame 3; a wire bonding for electrically connecting a chip pad (not shown) provided on the chip 2 to a corresponding one of the inner leads 5 of the lead frame 3; molding a certain area including the paddle 4 having the chip 2 thereon and the inner leads 5 by the molding compound 8; a trimming process for trimming a support bar (not shown) which connects the lead frame 3 to the paddle 4, a dam bar (now shown) connecting the outleads 6 to each other, and a section bar (not shown), thus to fabricate the packages 1, 1'; and a forming process for bending each of the outleads 6 to a certain extent to form a desired shape, thereby completing the fabrication of the chip packages 1, 1'.

However, the conventional semiconductor package has disadvantages in that a lead frame has to be formed separately depending on each of a variety of chip packages, and in particular when applied to a reverse type, a fabrication process or the shape of a lead frame has to be modified.

Further, the conventional semiconductor chip package has difficulty in stacking a plurality thereof on a PCB, and has led to an decreased electrical property due to a lengthened transfer path of a signal.

BRIEF DESCRIPTION OF THE PRESENT INVENTION

Accordingly, it is a first object of the present invention to provide a semiconductor chip package having a clip-type outlead and fabrication method thereof applicable to a variety of semiconductor chip packages and not required of modifying a fabrication process or a lead frame structure in mounting a reverse type or a horizontal type of outleads.

It is a second object of the present invention to provide a semiconductor chip package having a clip-type outlead and fabrication method thereof for easily stacking a plurality of semiconductor chip packages on a PCB.

It is a third object of the present invention to provide a semiconductor chip package having a clip-type outlead and fabrication method thereof for enhancing an electrical property by decreasing an electrical path.

To achieve the above-described objects, a clip type lead frame according to a preferred embodiment of the present invention includes a semiconductor chip having a plurality of bond pads thereon, a first package body having a recess formed in an upper surface thereof for receiving the semiconductor chip, a plurality of inner leads each connected electrically to a corresponding one of the bond pads, a plurality of outleads each extended from a corresponding one of the inner leads for covering along sides of the first package body, and a second package body which covers the semiconductor chip, a plurality of metallic wires and the inner leads.

Further, the fabrication method according to the present invention includes the steps of forming a first package body having a recess therein, attaching to the first package body a plurality of inner leads and outleads extended from the inner leads thus to be coveringly exposed on sides of the first package body, attaching in the recess a semiconductor chip having a plurality of bond pads thereon, wire-bonding for electrically connecting each of the inner leads by a metallic wire to a corresponding one of the bond pads provided on the semiconductor chip, and forming a second package body for covering the semiconductor chip, the inner leads and the metallic wires.

BRIEF DESCRIPTION OF THE DRAWINGS

FIG. 2 is a schematic cross-sectional view of a semiconductor chip package having clip type outleads according to the present invention;

DETAILED DESCRIPTION OF THE PRESENT INVENTION

Figure 1A:
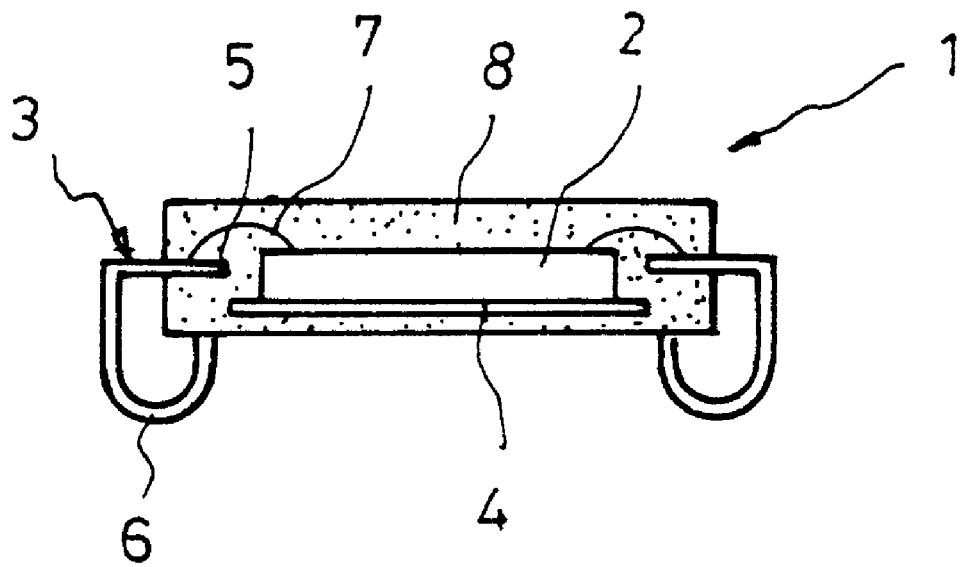
FIGS. 1 and 2 are schematic cross-sectional views each showing an inner structure of a conventional semiconductor chip package.
Figure 1B:
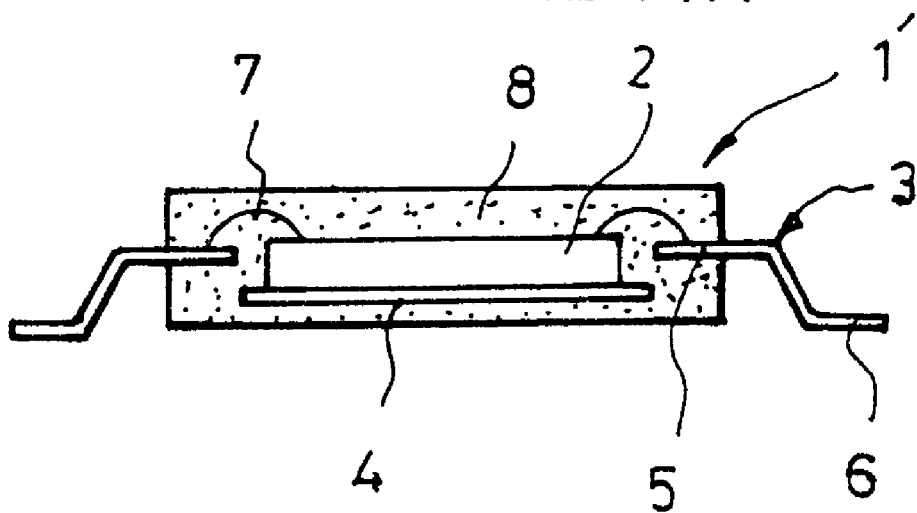
Figure 2:
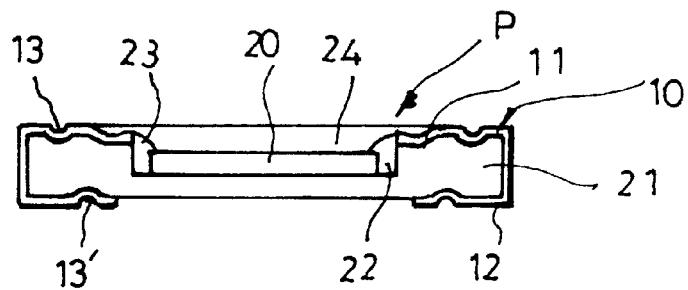

As shown in FIG. 2, the semiconductor chip package P according to a first embodiment of the present invention includes: a semiconductor chip 20; a package body 21 having a recess 22 formed in the surface thereof in order to receive the chip 20 therein; a plurality of inner leads 11 each connected electrically to a bond pad (not shown) formed on the chip 20; a clip type lead frame 10 including a plurality of outleads 12 each extended from a corresponding one of the inner leads 11 and being bent to be shaped after a staple thus to be tightly fixed onto the package body 21; and a molding compound 24 for molding a certain portion of the package body 21 including the semiconductor chip 21, a plurality of wires 23 and the inner leads 11.

The lead frame 10 including the inner leads 11 and the outleads 12 tightly and attachedly covers along sides of the package body 21, and each of the outleads 12 has a first and second crooked portions 13, 13' each at an upper and a lower portion thereof so that the staple shaped outleads 12 serve to tightly and fixingly fasten the package body 21. At this time, the crooked portion can be selectively formed at an upper or a lower portion of the outlead 12 but it is preferred to form at an upper and a lower portion of the outleads 12.

Figure 3:
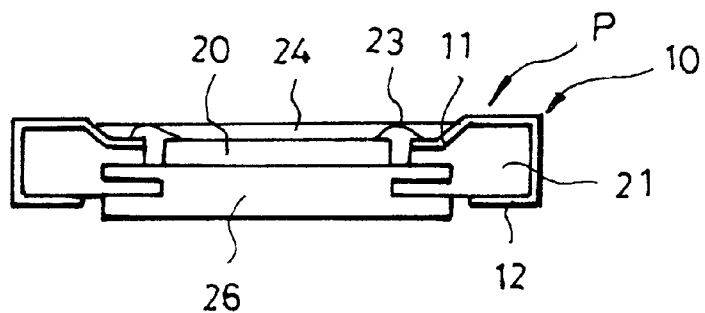
FIG. 3 is a schematic cross-sectional view of a semiconductor chip package including a high thermal performance having clip type outleads according to the present invention.

With reference to FIG. 3 adapting the same reference numerals as used in FIG. 2, a semiconductor chip package according to a second embodiment of the present invention includes: a semiconductor chip 20; a package body 21 on which a semiconductor chip 20 is mounted and in which a part of a heat spread 26 for emitting heat caused by the chip 20 is embedded; a plurality of inner leads 11 each electrically connected by a bond pad (not shown) and a wire 23 to the chip 20; a clip type lead frame 10 including a plurality of outleads 12 each extended from a corresponding one of the inner leads 11 and being bent to be shaped after a staple thus to be tightly fixed onto the package body 21; and a molding compound 24 for molding a certain portion of the package body 21 including the semiconductor chip 21, a plurality of wires 23 and the inner leads 11.

The outleads of the chip package according to the second embodiment of the present invention expose three sides thereof and accordingly can be used as a mounting surface when mounted on a PCB.

The fabrication method of the thusly composed semiconductor package P will now be described.

First, the package body 21 having a recess 22 in the upper surface of the package body 21 is formed, and also the body formation may be carried out after providing a heat spread 26 in the package body 21.

Then, the clip type lead frame 10 is coveringly fixed onto the body 21, and a semiconductor chip 20 is attached in the recess 22 of the body 21. Here, the fabrication process for a lead frame fixing and a chip attachment is not necessarily required to follow the same order.

Thereafter, the inner leads 11 of the lead frame 10 and a corresponding one of the bond pads (not shown) provided on the chip 20 are electrically connected by a wire 23 to each other.

The process is completed by molding, potting or sealing a certain area of the package body 21 using a molding compound 24.

Figures 4A, 4B:
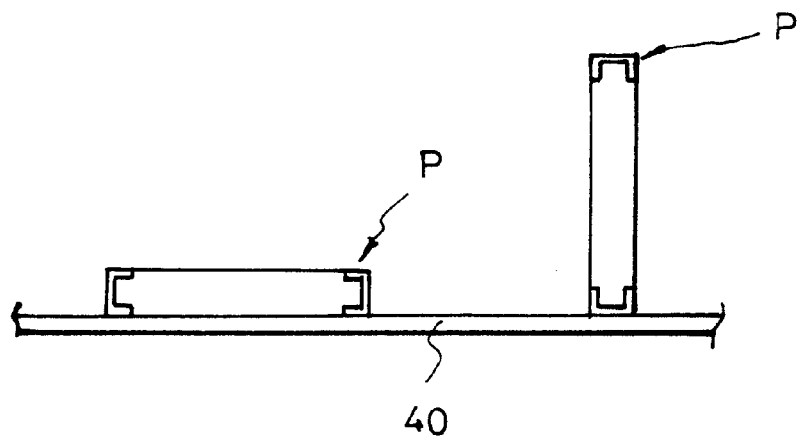
FIG. 4A is a side view showing a semiconductor chip package having clip type outleads according to the present invention, which package is horizontally mounted on a printed circuit board.
FIG. 4B is a side view showing a semiconductor chip package having clip type outleads according to the present invention, which package is vertically mounted on a printed circuit board.

The semiconductor package P according to the present invention may be mounted horizontally as shown in FIG. 4A or vertically as shown in FIG. 4B, on a PCB 40.

Figure 4C:
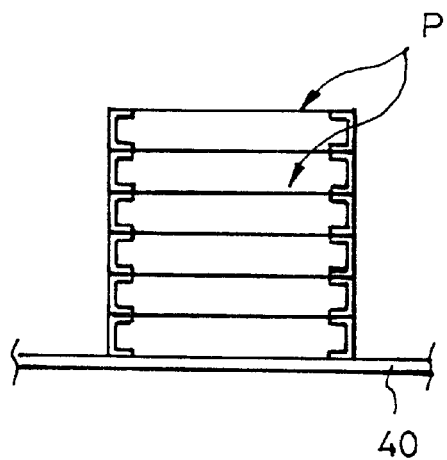
FIG. 4C is a side view showing a stacked set of semiconductor chip packages each having clip type outleads according to the present invention, each of which packages is mounted on a printed circuit board.
Figure 4D:
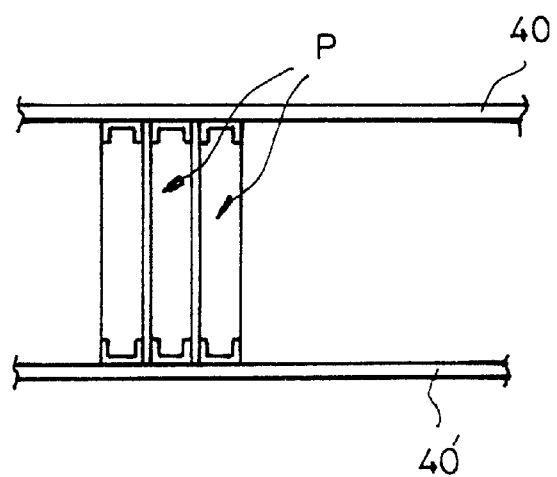
FIG. 4D is a side view showing a set of semiconductor chip packages each having clip type outleads according to the present invention, each of which packages is horizontally stacked between a pair of printed circuit boards.

Also, as shown in FIG. 4C, a plurality of chip packages P may be vertically stacked on the PCB 40, and as shown in FIG. 4D, a plurality of upright semiconductor packages may be horizontally stacked between a pair of PCBs 40, 40' to thereby obtain a dual terminal type package set.

Figure 5A:
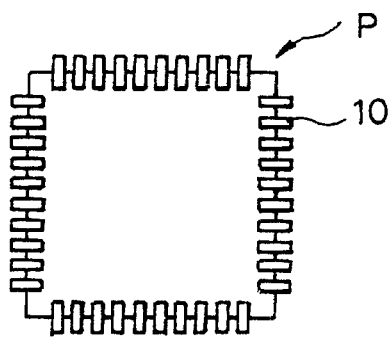
FIG. 5A is a schematic plan view of a quad type semiconductor chip package having clip type outleads according to the present invention.
Figure 5B:
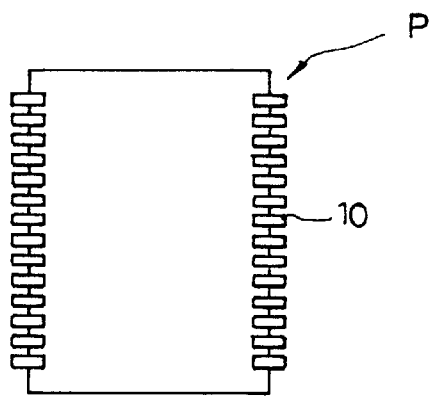
FIG. 5B is a schematic plan view of a dual-line semiconductor chip package having clip type outleads according to the present invention.
Figure 5C:
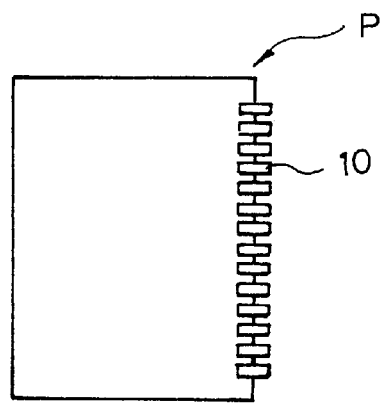
FIG. 5C is a schematic plan view of a single-line semiconductor chip package having clip type outleads according to the present invention.

As shown in FIGS. 5A–5C, depending on a method of providing a clip type lead frame, the semiconductor chip package according to the present invention can be varied to a quad type package in FIG. 5A, a dual line type package in FIG. 5B and a single line type package in FIG. 5C.

Figure 6:
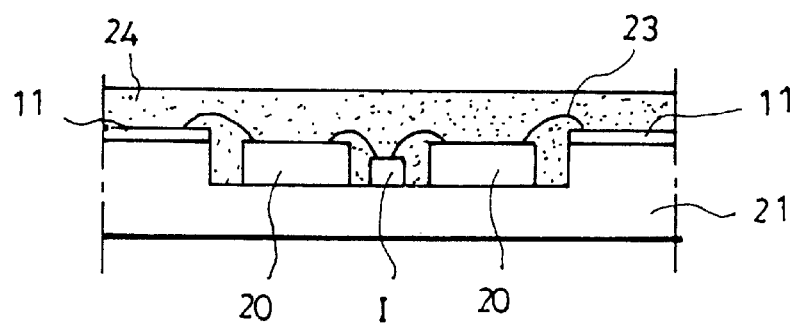
FIG. 6 is a schematic partial view of a multi-chip module package including a plurality of semiconductor chip packages therein according to the present invention.

Referring to FIG. 6, the semiconductor chip package according to the present invention is applicable to a multi-chip module (MCM) package without modifying the package structure. That is, a plurality of chips 20 and a plurality of connection leads I are provided in a recess 22 of the package body 21, a clip type lead frame 10 being insertingly provided in the package body 21, and the inner leads 11 and the chip 20 and the connection leads I are electrically connected by a wire 23 to each other to thereby complete the fabrication.

As described above, the semiconductor chip package having a clip-type outlead thereof according to the present invention simplifies the package fabrication process by using a ready made clip type lead frame.

Further, the present invention improves the rate of a signal flow by decreasing an electrical path, serves to fabricate a variety of chip packages by using a single kind of lead frame, betters a solder fatigue property due to a fact that when a package is mounted on a PCB, irrespective of a narrow interval between the PCB and the chip package the outleads are clipped on the package body instead of being simply attached thereto.

Still further, the chip package according to the present invention can be vertically or horizontally mounted on the PCB and also easily stacked with other packages to thereby facilitate a memory extension.

Furthermore, the semiconductor chip package according to the present invention prevents a thermal mismatch, a delamination and a moisture intrusion.

What is claimed is:

1. A method of fabricating a chip package, comprising the steps of:

forming a first package body;

attaching a plurality of leads to the first package body, wherein each of the leads includes an inner portion and an outer portion, and wherein the outer portion of each lead is in contact with top, side and bottom surface portions of the first package body;

attaching a chip having a plurality of bond pads to the first package body; and electrically connecting bond pads of the chip to inner portions of corresponding ones of the leads.

2. The method of claim 1, wherein the forming step comprises forming the first package body such that it has a recess, and wherein the step of attaching a chip comprises attaching the chip to the recess of the first package body.

3. The method of claim 1, further comprising the step of forming a second package body on the first package body such that the second package body covers the chip.

4. The method of claim 1, wherein the step of attaching a plurality of leads further comprises attaching leads having a first bent portion, wherein the first bent portion of each lead is located on a part of the outer portion of the lead that covers a top surface of the first package body, and wherein the first bent portion extends into a depression formed on a top surface of the first package body.

5. The method of claim 4, wherein the step of attaching a plurality of leads further comprises attaching leads having a second bent portion, wherein the second bent portion of each lead is located on a part of the outer portion of the lead that covers a bottom surface of the first package body, and wherein the second bent portion extends into a depression formed on a bottom surface of the first package body.

6. The method of claim 5, wherein the step of attaching a plurality of leads further comprises attaching leads wherein the first and second bent portions extend towards one another.

7. The method of claim 1, wherein the forming step further comprises forming the first package body such that a heat sink is located in a central portion of the first package body, and wherein the step of attaching a chip comprises attaching the chip to a first surface of the heat sink.

8. The method of claim 7, wherein the forming step further comprises forming the first package body such that a second surface of the heat sink is exposed outside the package.

9. The method of claim 1, wherein the electrically connecting step comprises attaching bond pads of the chip to inner portions of corresponding ones of the leads with a plurality of wires.

10. A method of fabricating a chip package, comprising the steps of:
   forming a first package body;
   attaching a heat sink to a central portion of the first package body;
   attaching a plurality of leads to the first package body, wherein each of the leads includes an inner portion and an outer portion, and wherein the outer portion of each lead covers top, side and bottom surface portions of the first package body;
   attaching a chip having a plurality of bond pads to a first surface of the heat sink; and
   electrically connecting bond pads of the chip to inner portions of corresponding ones of the leads.

11. The method of claim 10, wherein the step of attaching a heat sink comprises attaching the heat sink to the first package body such that the first surface of the heat sink is recessed below a top surface of the first package body.

12. The method of claim 10, wherein the step of forming a first package body comprises forming a first package body having at least one depression in a top surface of the first package body.

13. The method of claim 12, wherein the step of attaching a plurality of leads comprises attaching leads wherein the outer portion of each of the leads includes at least one bent portion, and wherein the at least one bent portion of each lead extends into a depression in the top surface of the first package body.

14. The method of claim 13, wherein the step of forming a first package body further comprises forming the first package body so that it has at least one depression in a bottom surface of the first package body, and wherein the step of attaching a plurality of leads further comprises attaching the leads such that a bent portion of each lead extends into a depression in the bottom surface of the first package body.

15. The method of claim 10, wherein the step of attaching a heat sink comprises attaching the heat sink to the first package body such that a second surface of the heat sink is exposed through a bottom surface of the first package body.

16. The method of claim 15, further comprising a step of forming a second package body on the first package body such that the second package body covers the chip.

17. The method of claim 16, wherein the step of forming a second package body comprises forming the second package body such that the second surface of the heat sink remains exposed through the bottom surface of the first package body.

* * * * *